(12) United States Patent
Aquilino et al.

(10) Patent No.: US 8,969,163 B2
(45) Date of Patent: Mar. 3, 2015

(54) FORMING FACET-LESS EPITAXY WITH SELF-ALIGNED ISOLATION

(75) Inventors: Michael V. Aquilino, Hopewell Junction, NY (US); Byeong Yeol Kim, Lagrangeville, NY (US); Ying Li, Newburgh, NY (US); Carl John Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 13/556,406

(22) Filed: Jul. 24, 2012

(65) Prior Publication Data

US 2014/0027820 A1 Jan. 30, 2014

(51) Int. Cl.
*H01L 21/336* (2006.01)
*H01L 21/8234* (2006.01)
*H01L 21/70* (2006.01)

(52) U.S. Cl.
USPC .... 438/294; 438/197; 257/374; 257/E21.414; 257/E21.444

(58) Field of Classification Search
USPC ........................................ 257/374
See application file for complete search history.

(56) References Cited

U.S. PATENT DOCUMENTS

| | | | |
|---|---|---|---|
| 5,168,089 A | 12/1992 | Feyenson et al. | |
| 5,273,621 A | 12/1993 | Feygenson et al. | |
| 6,617,226 B1 | 9/2003 | Suguro et al. | |
| 6,989,316 B2 | 1/2006 | Suguro et al. | |
| 2006/0275975 A1* | 12/2006 | Yeh et al. | 438/216 |
| 2006/0286729 A1* | 12/2006 | Kavalieros et al. | 438/183 |
| 2008/0237734 A1* | 10/2008 | Hung et al. | 257/374 |
| 2012/0056245 A1* | 3/2012 | Kang et al. | 257/192 |
| 2012/0153385 A1* | 6/2012 | Seo | 257/334 |
| 2013/0140639 A1* | 6/2013 | Shieh et al. | 257/368 |

OTHER PUBLICATIONS

Pending U.S. Appl. No. 13/478,411, filed May 23, 2012, Titled: "Forming facet-less epitaxy with a cut mask".
Blosse et al., "A Novel Low Cost 65nm CMOS Process Architecture With Self Aligned Isolation and W Cladded Source/Drain", Cypress Semiconductor, San Jose, CA, 2004 IEEE, pp. 28.5.1-28.5.4.

* cited by examiner

*Primary Examiner* — William F Kraig
*Assistant Examiner* — Khaja Ahmad
(74) *Attorney, Agent, or Firm* — Keivan Razavi; Yuanmin Cai

(57) ABSTRACT

A method of forming a semiconductor structure may include preparing a continuous active layer in a region of the substrate and forming a plurality of adjacent gates on the continuous active layer. A first raised epitaxial layer may be deposited on a recessed region of the continuous active layer between a first and a second one of the plurality of gates, whereby the first and second gates are adjacent. A second raised epitaxial layer may be deposited on another recessed region of the continuous active layer between the second and a third one of the plurality of gates, whereby the second and third gates are adjacent. Using a cut mask, a trench structure is etched into the second gate structure and a region underneath the second gate in the continuous active layer. The trench is filled with isolation material for electrically isolating the first and second raised epitaxial layers.

18 Claims, 15 Drawing Sheets

(PIOR ART)

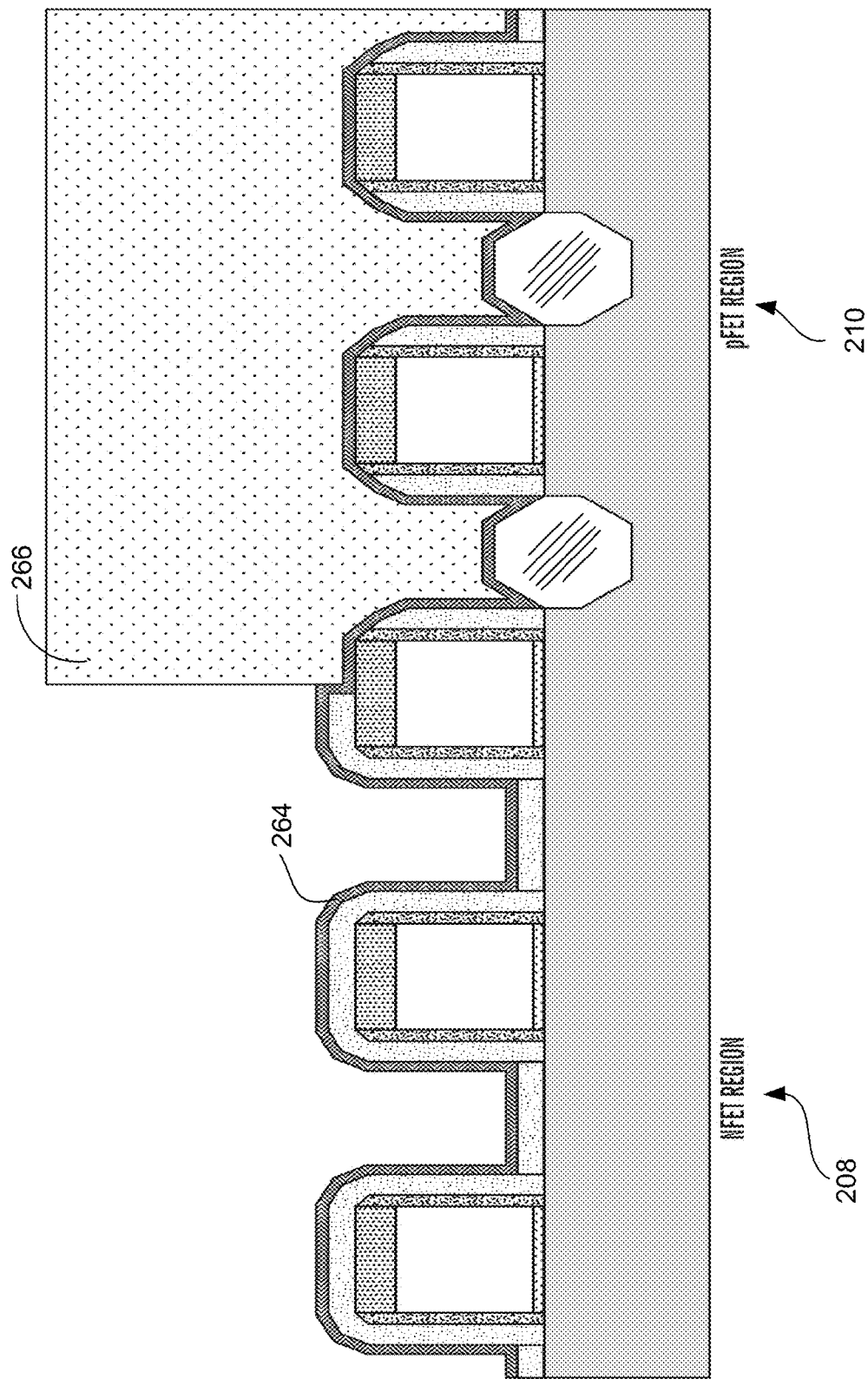

FORMING FACET-LESS EPITAXY WITH SELF-ALIGNED ISOLATION

BACKGROUND a. Field of Invention

The present invention generally relates to integrated circuit devices, and particularly to forming facet-less epitaxially grown regions at self-aligned isolation region edges.

b. Background of Invention

Due to the nature of epitaxial growth and certain structural features of integrated circuit devices, epitaxially grown regions may exhibit undesirably formed shapes that impact device performance and reliability. For example, the formation of epitaxially grown raised source/drain regions at the edge of shallow trench isolation (STI) regions of semiconductor devices may cause the raised source/drain regions to have facetted shapes at the STI region edges. The facetted shape of these raised source/drain regions may reduce the surface area of the raised source/drain regions. This reduced surface area in turn may cause a reduction of areas for forming contacts and consequently undesirably increase the resistance between the raised source/drain regions and the formed contacts that provide electrical connectivity for the device to be operable. Thus, since within integrated circuits a vast number of connections are needed, any degradation in connection resistance may compromise device performance within the integrated circuits and in some cases, therefore, cause a reduction in device yield.

FIG. 1 refer to a semiconductor structure 100 derived from a processes associated with growing epitaxial regions at the edges of STI regions formed on an SOI substrate, as is known in the art. In particular, FIG. 1 illustrates grown source/drain regions 130 and 170 for nFET and pFET devices 101 and 103, respectively. As depicted, the source/drain regions 130, 170 are grown at the edge of STI region 102, which includes divots 140, 180.

Source/drain regions 130 and 170 are formed after creating STI region 102. As depicted, the STI region 102 includes divots 140 and 180, which are a bi-product of the STI formation process. Since the STI region 102 and its corresponding divots 140, 180 are formed prior to growth of the source/drain regions 130, 170, during such epitaxial growth; faceting occurs at the respective interfaces 138, 141 between the grown source/drain regions 130, 170 and the STI region 102. Accordingly, based on the created facets 176, 132 that result from the formed divots 180, 140 associated with STI region 102, source/drain regions 130 and 170 include reduced contact surfaces S1 and S1' for connecting to contacts 190b and 190c, respectively. The reduced surfaces may establish a poor electrical connection with the contacts 190b, 190c. Poor electrical connections cause increased contact resistance and, therefore, a potential device operation failure.

In contrast, source/drain regions 128 and 172, which are not located adjacent the STI region 102, are not effected by the STI region's 102 formed divots 180, 140 and, therefore, do not exhibit the faceting observed at source/drain regions 130 and 170. Therefore, contact surfaces S2 and S2' for connecting to contacts 190a and 190d, respectfully, provide optimal electrical connectivity relative to contact surfaces S1 and S1'.

BRIEF SUMMARY

It may, therefore, be advantages to provide, among other things, isolation regions for separating devices on a semiconductor substrate without undesirable faceting effects.

According to at least one exemplary embodiment, a method of forming a semiconductor structure on a substrate is provided. The method may include preparing a continuous active layer on top of a region of the substrate and forming a plurality of gates on the continuous active layer. A first raised epitaxial layer may be deposited on a first recessed region of the continuous active layer, whereby the first recessed region is located between a first and a second one of the plurality of gates such that the first and the second one of the plurality of gates are adjacent. A second raised epitaxial layer may be deposited on a second recessed region of the continuous active layer, whereby the second recessed region is located between the second and a third one of the plurality of gates such that the second and the third one of the plurality of gates are adjacent. Using a cut mask, a trench structure is etched into the second one of the plurality of gate structures and a region underneath the second one of the plurality of gate structures in the continuous active layer. The trench structure is filled with isolation material, whereby the isolation material electrically isolates the first raised epitaxial layer from the second raised epitaxial layer.

According to at least one other exemplary embodiment, a semiconductor structure may include a substrate, an active layer located in a region of the substrate, and a plurality of adjacent gates located on a region of the active layer, where the plurality of gates includes a first gate and a second gate. A trench structure extends into the active layer, whereby the trench structure may have a first side wall partially comprising a first gate spacer of a dummy gate and a second side wall partially comprising a second gate spacer of the dummy gate. The trench structure is located adjacent to both the first gate and the second gate. A first raised epitaxial layer is located on top of a first recessed region of the active layer and the first recessed region is located between the first gate and the trench structure. A second raised epitaxial layer is located on top of a second recessed region of the active layer and the second recessed region is located between the second gate and the trench structure. The trench structure is filled with isolation material for electrically isolating the first raised epitaxial layer from the second raised epitaxial layer.

According to yet another exemplary embodiment, a method of forming a semiconductor structure on a substrate is provided. The method may include preparing a continuous active layer in a region of the substrate and forming a first gate, a dummy gate, and a second gate on top of the continuous active layer of the substrate, whereby the dummy gate includes at least one pair of spacers. A first raised epitaxial layer is deposited on a first recessed region of the continuous active layer such that the first recessed region is located between the first gate and the dummy gate. The first gate and the dummy gate are adjacent. A second raised epitaxial layer is deposited on a second recessed region of the continuous active layer such that the second recessed region is located between the dummy gate and the second gate. The dummy gate and the second gate are also adjacent. A trench structure is etched into the dummy gate and a region underneath the dummy gate in the continuous active layer, whereby the etching of the trench structure into the dummy gate is selective to the at least one pair of spacers. The trench structure is filled with isolation material for electrically isolating the first raised epitaxial layer from the second raised epitaxial layer.

DETAILED DESCRIPTION

The embodiments described herein provide structures and processes for creating facet-less epitaxial growth regions (e.g., source/drain regions) at the edge of isolation regions by providing a dummy gate that is utilized for creating self-aligned isolation between the epitaxially grown regions.

Figure 2A:
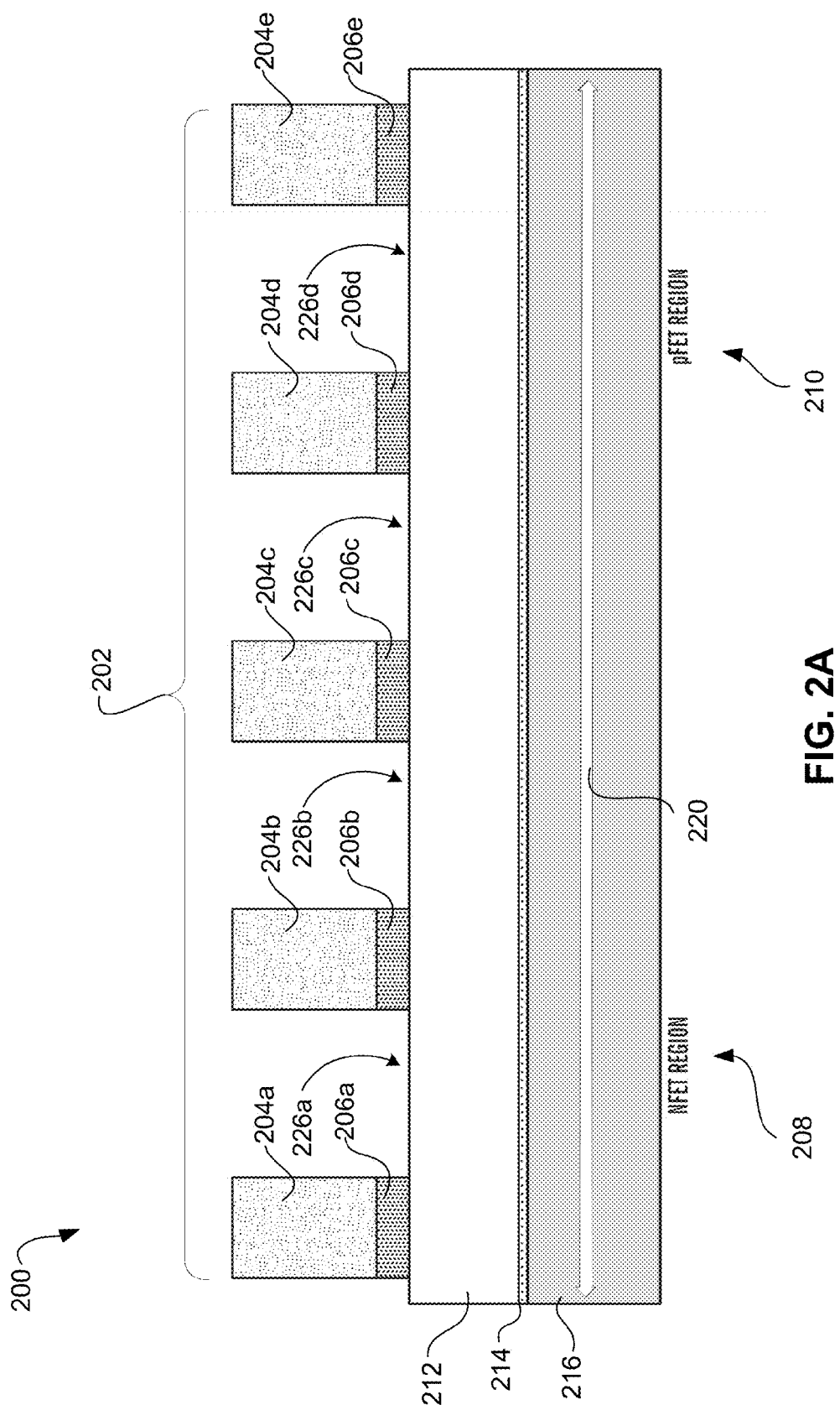
FIGS. 2A-2N are vertical cross-sectional views of a semiconductor structure that illustrate the formation of facet-less epitaxial regions, according to at least one embodiment; and The drawings are not necessarily to scale. The drawings are merely schematic representations, not intended to portray specific parameters of the invention. The drawings are intended to depict only typical embodiments of the invention. In the drawings, like numbering represents like elements.
Figure 2B:
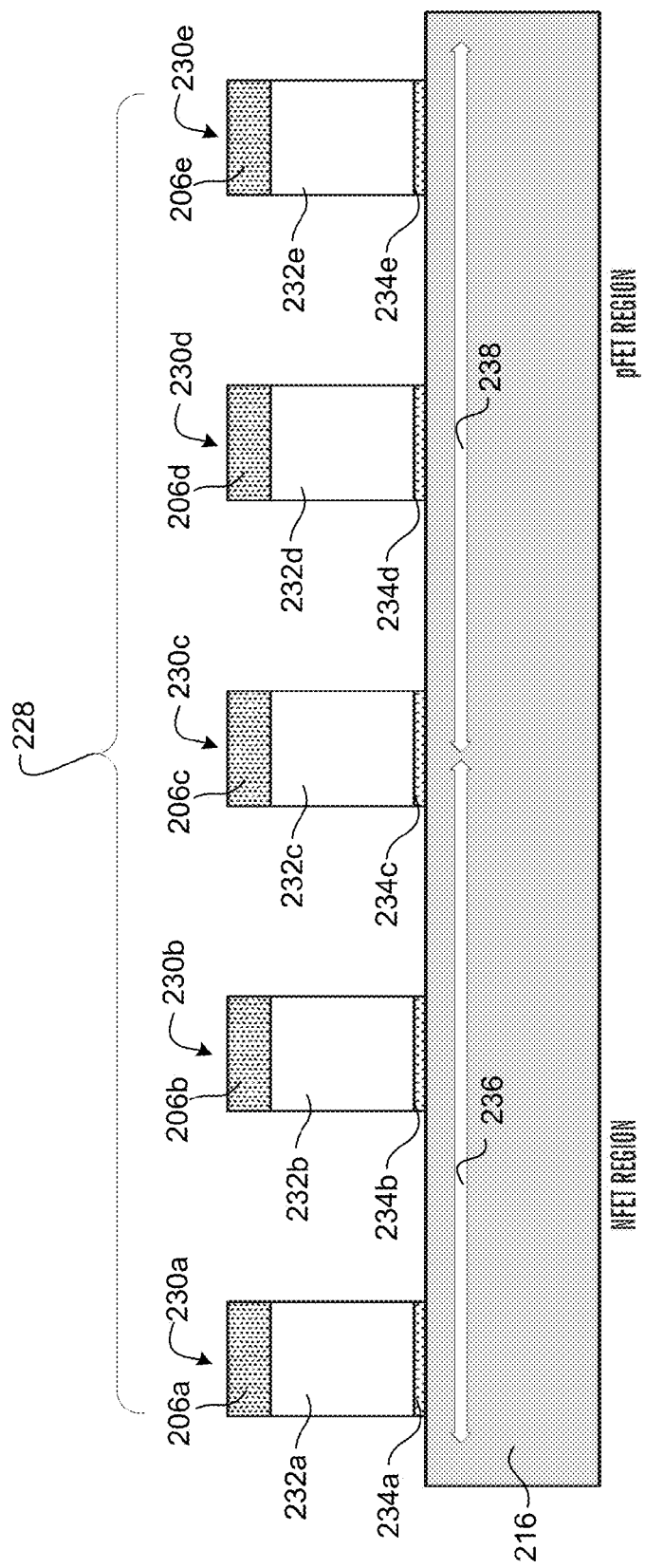
Figure 2C:
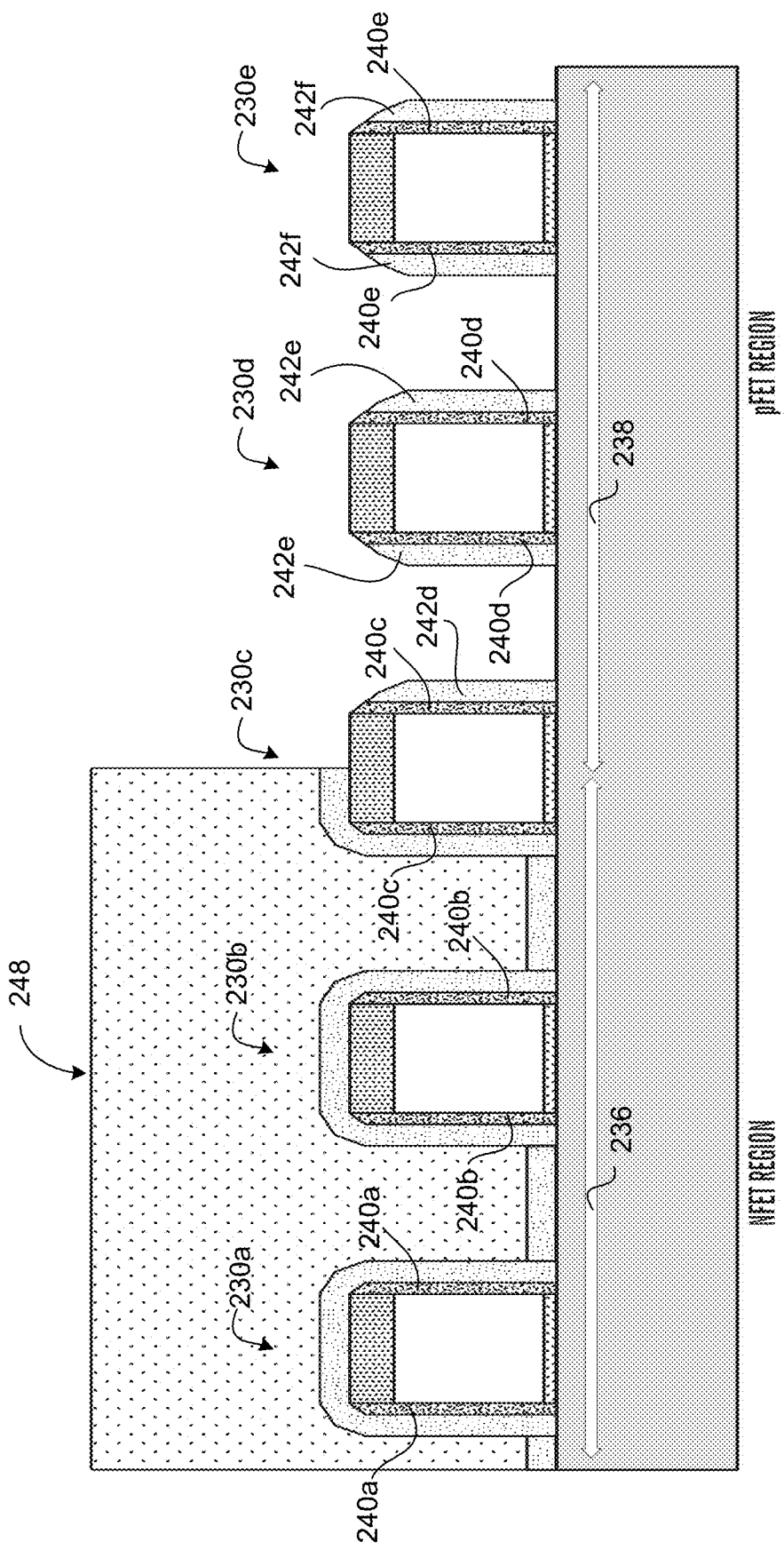
Figure 2D:
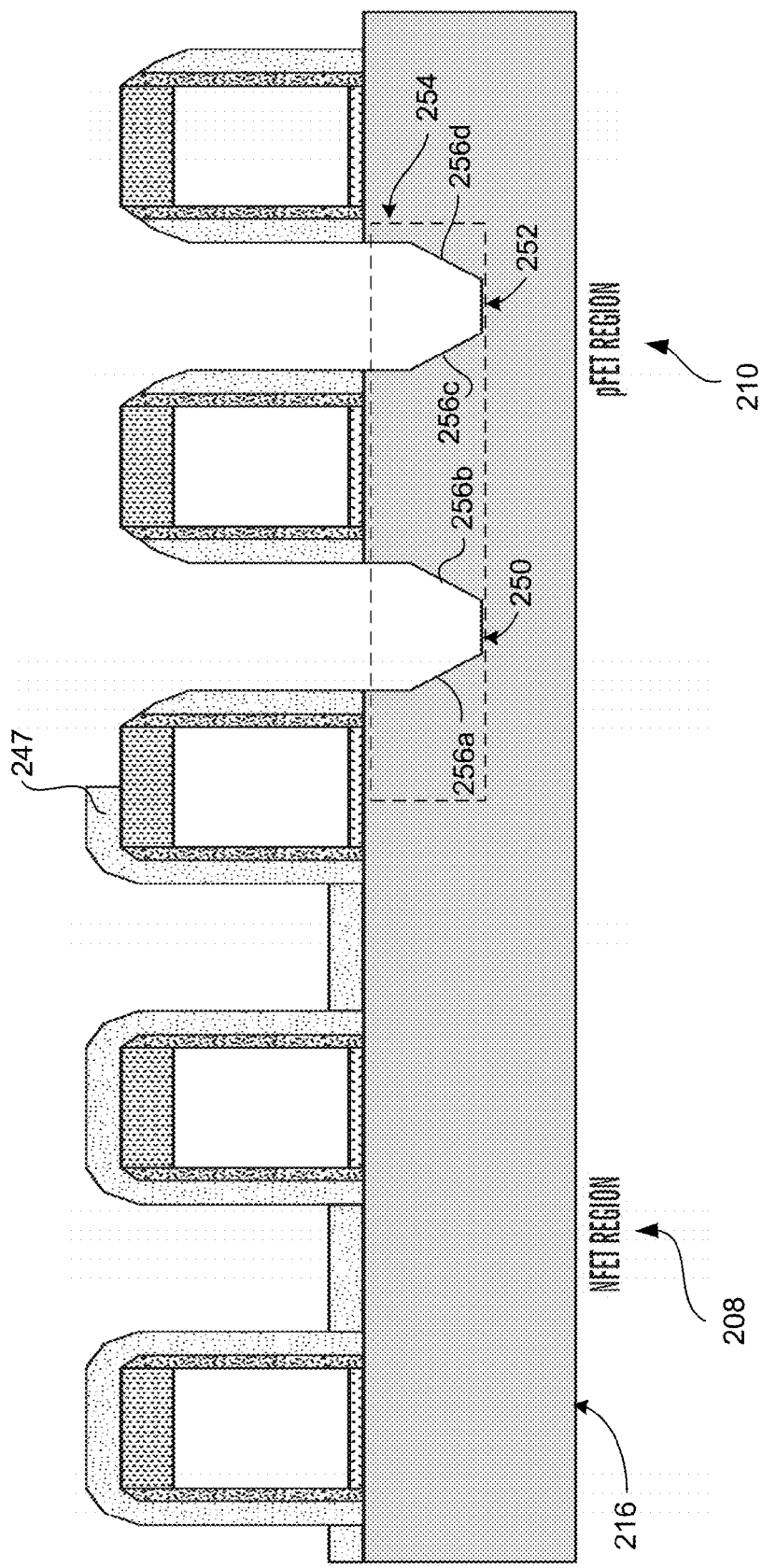
Figure 2E:
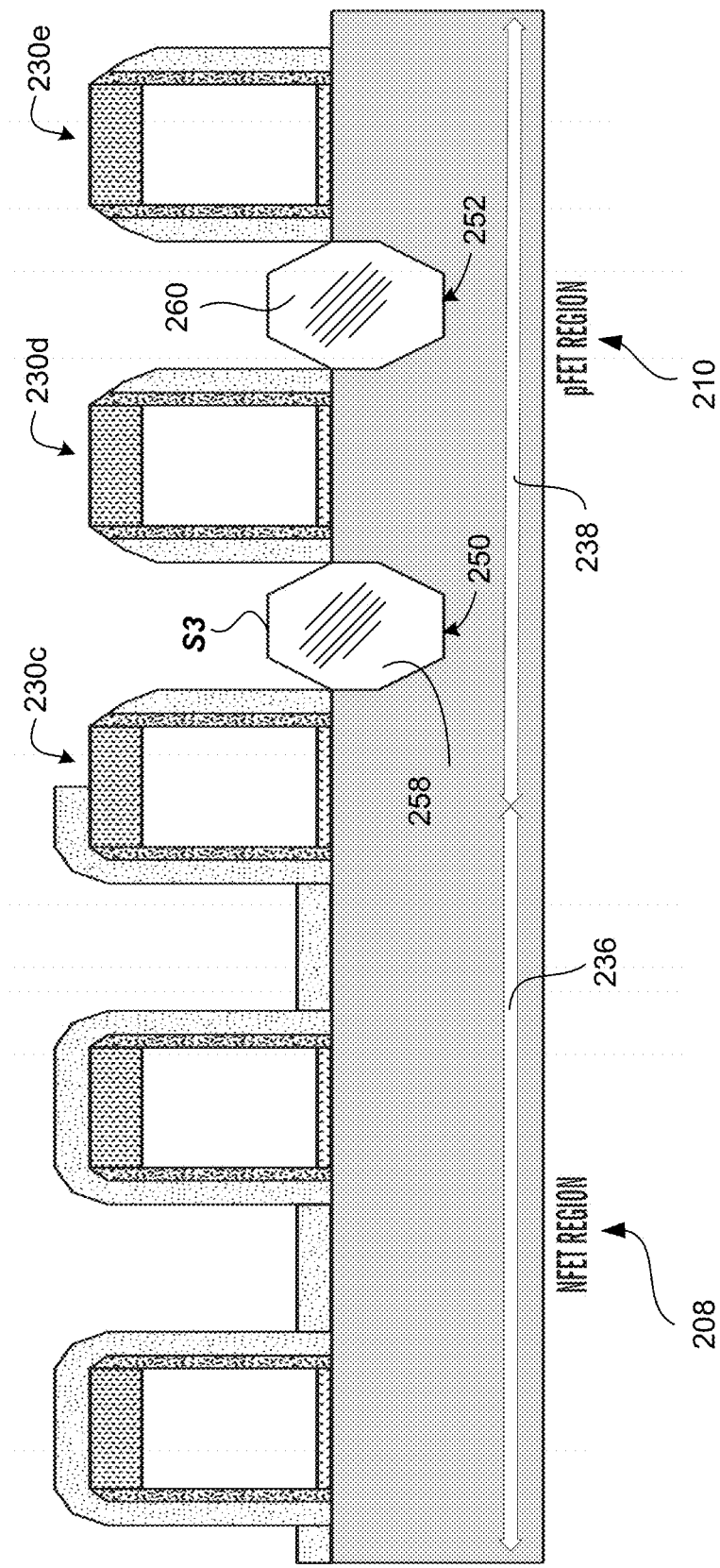
Figure 2G:
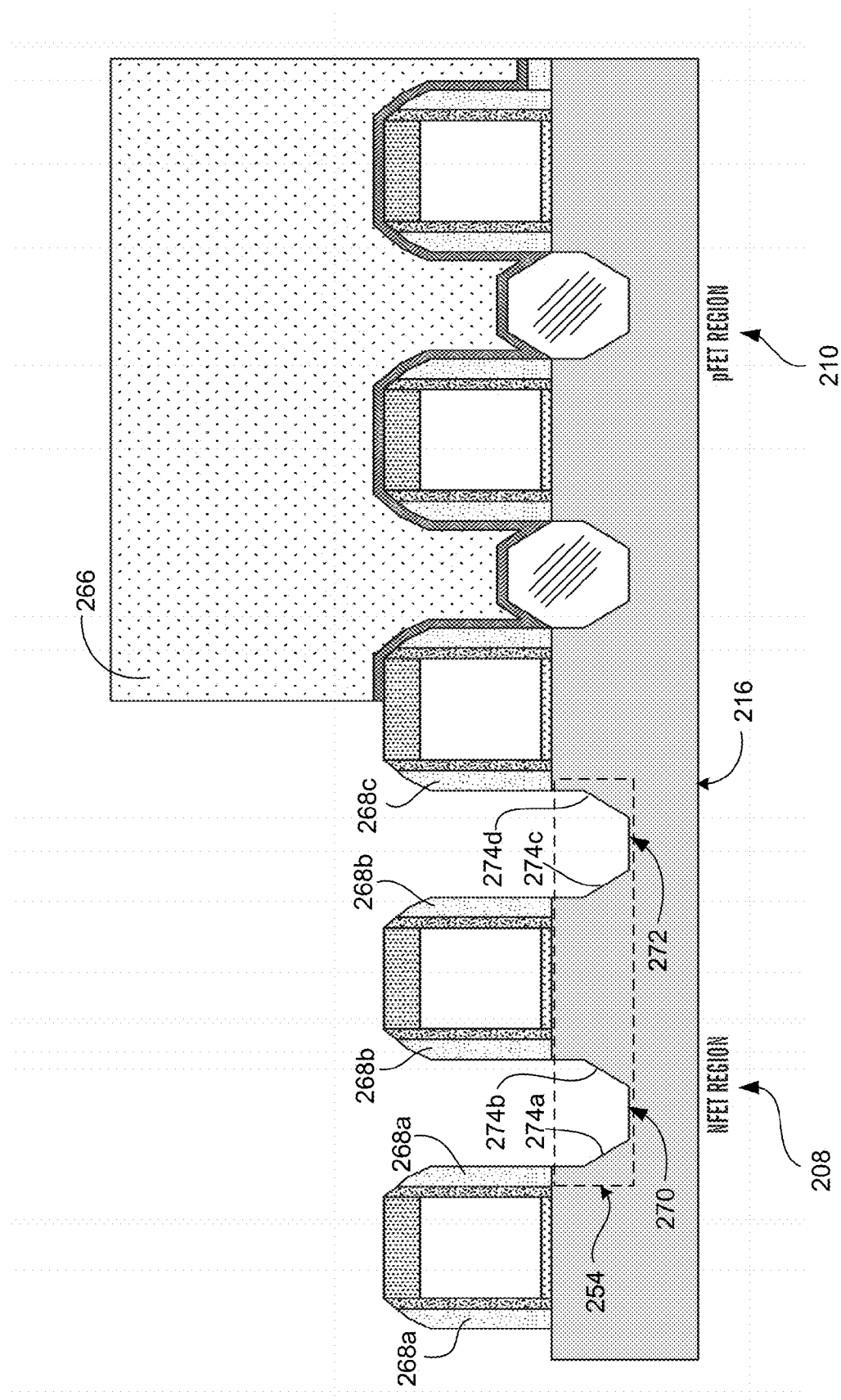
Figure 2H:
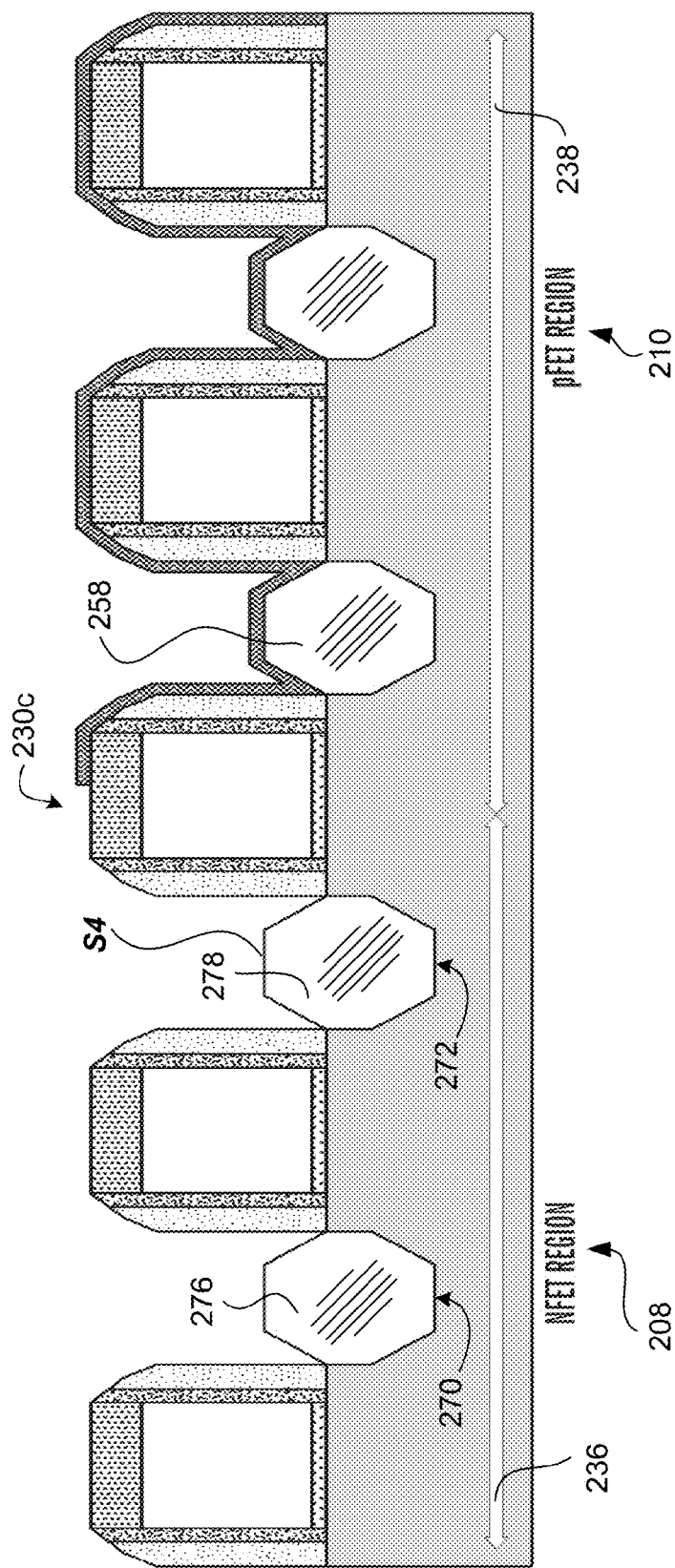
Figure 21:
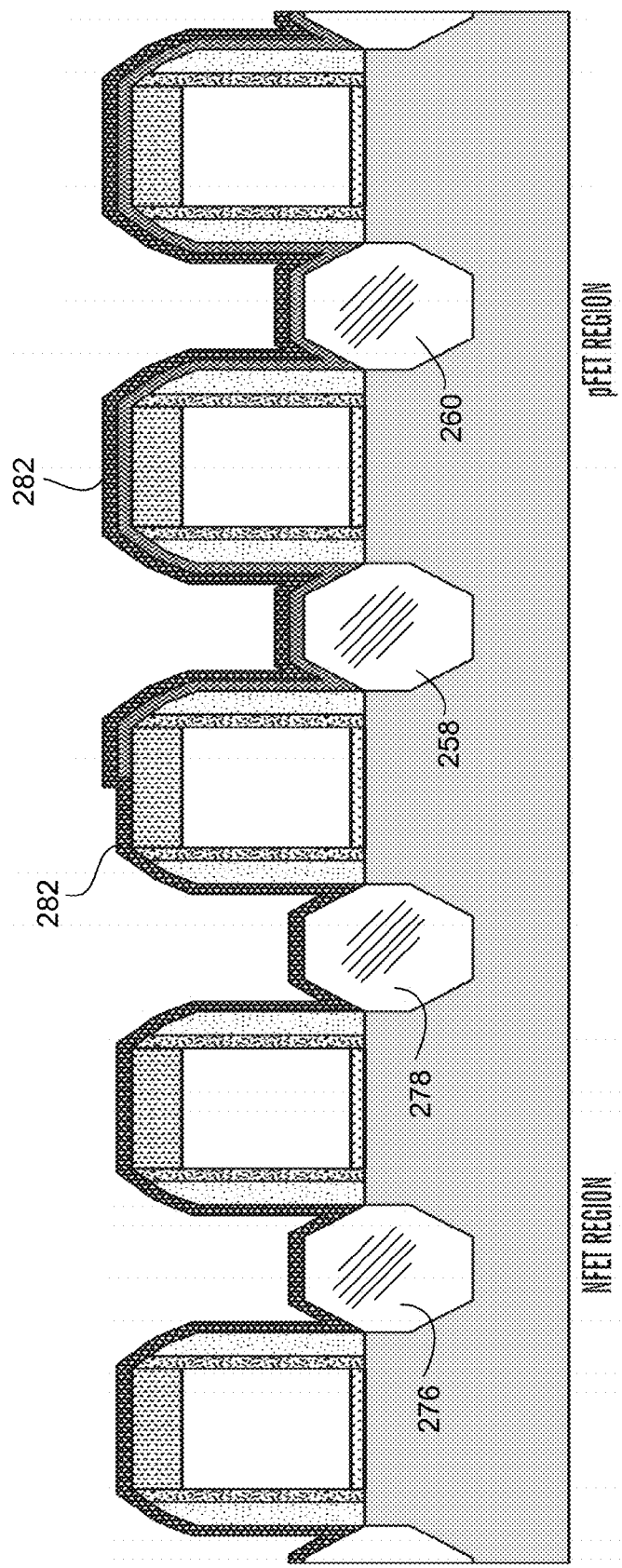
Figure 2J:
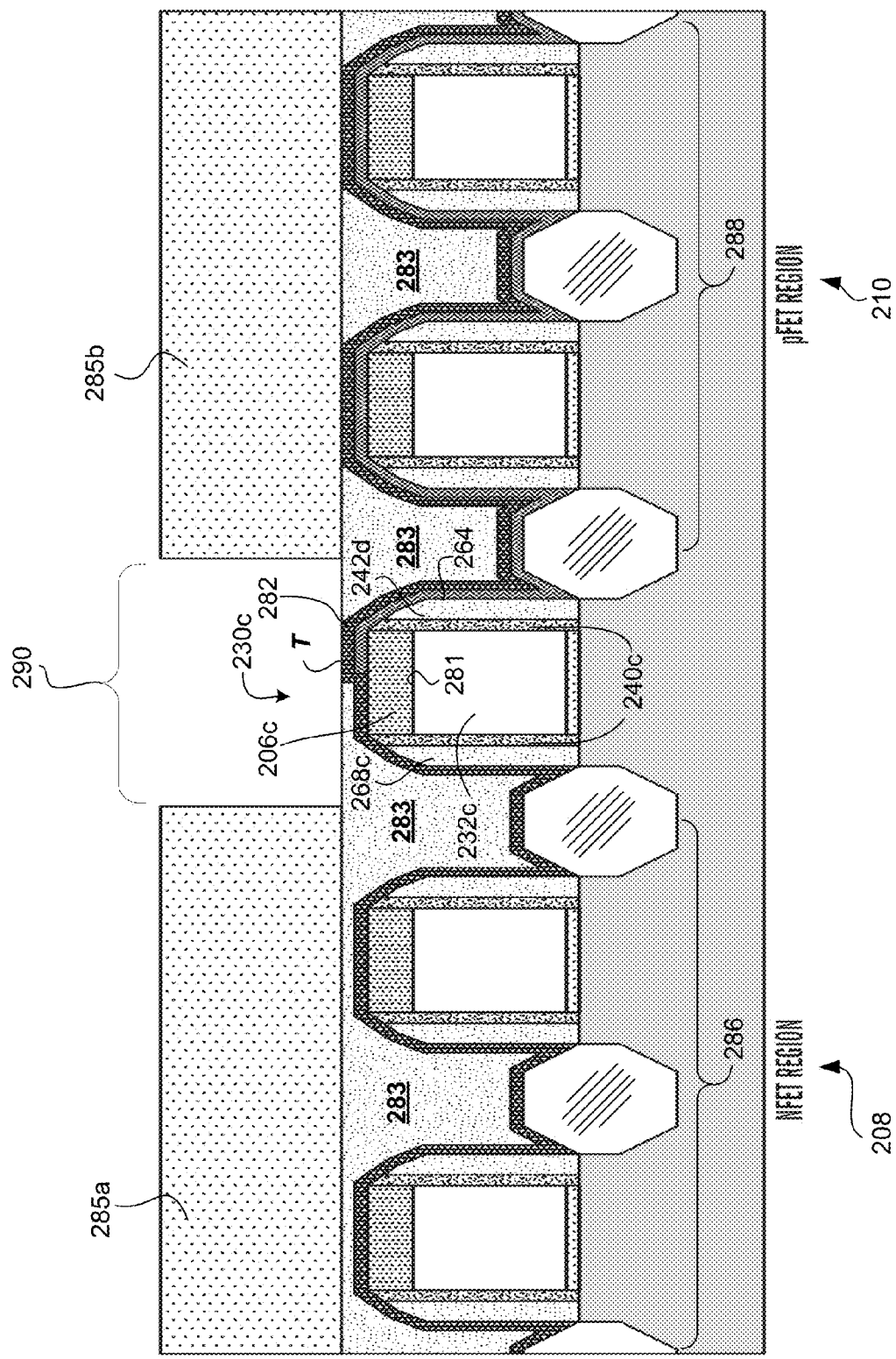
Figure 2K:
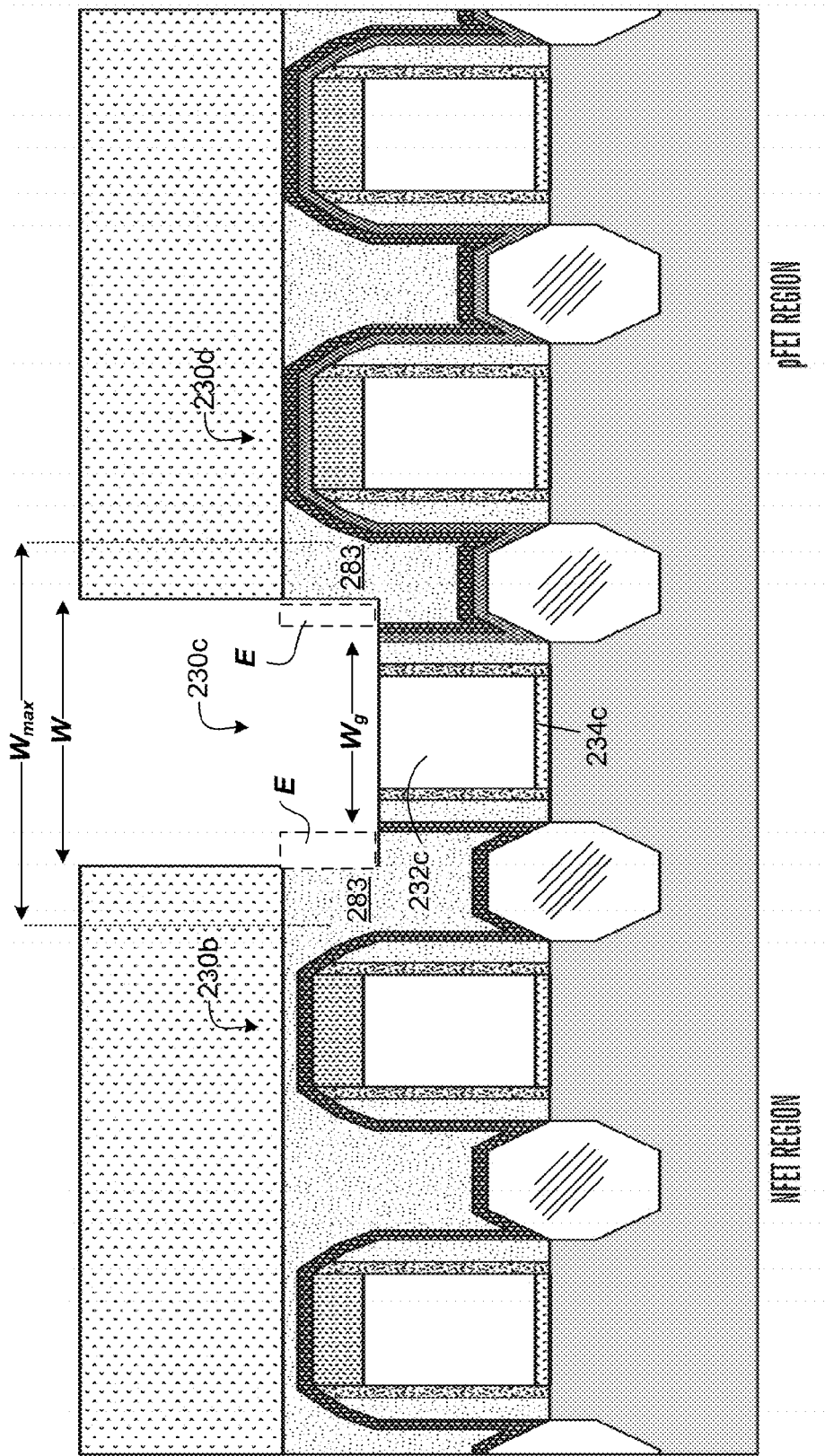
Figure 2L:
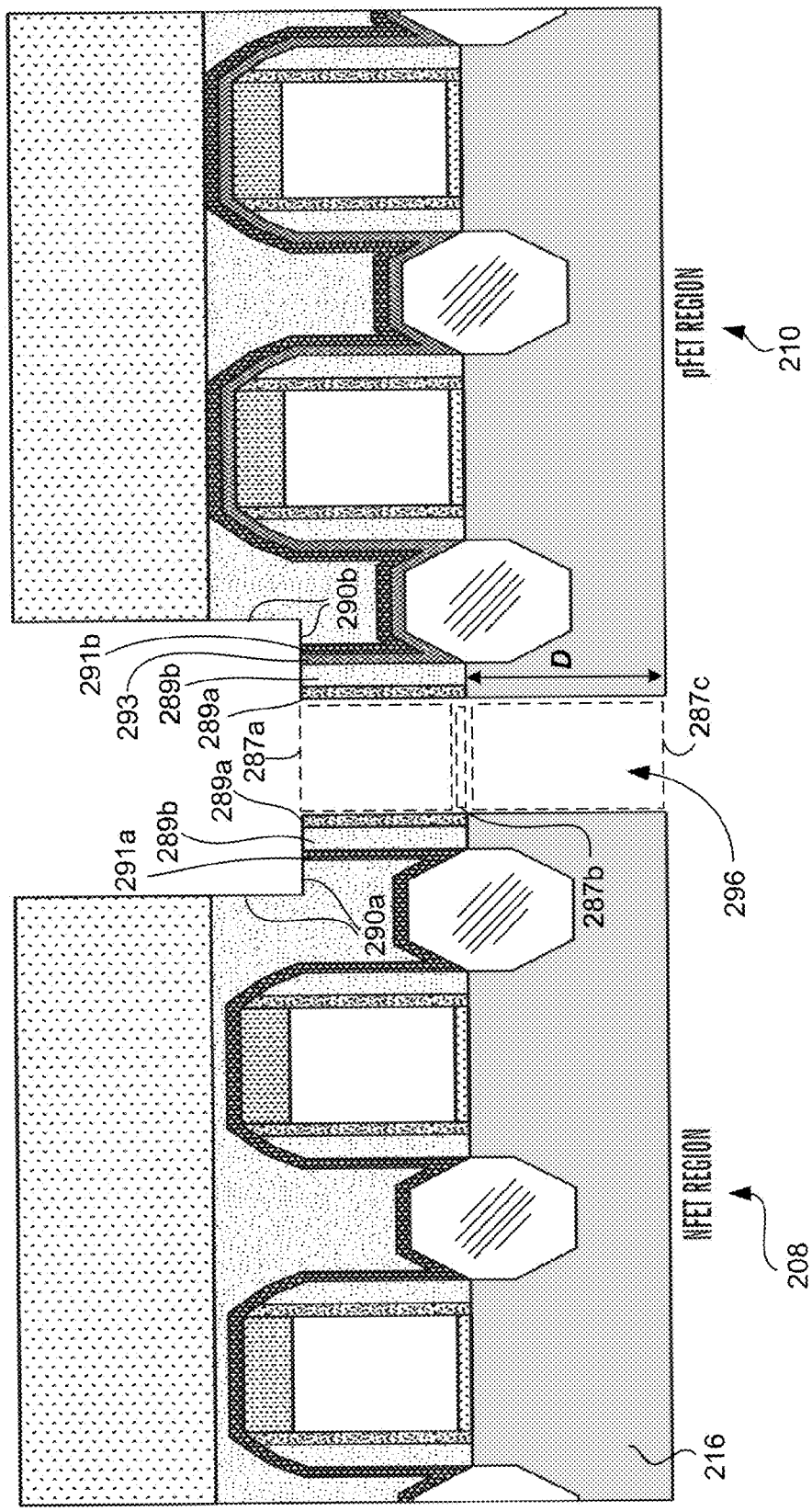
Figure 2M:
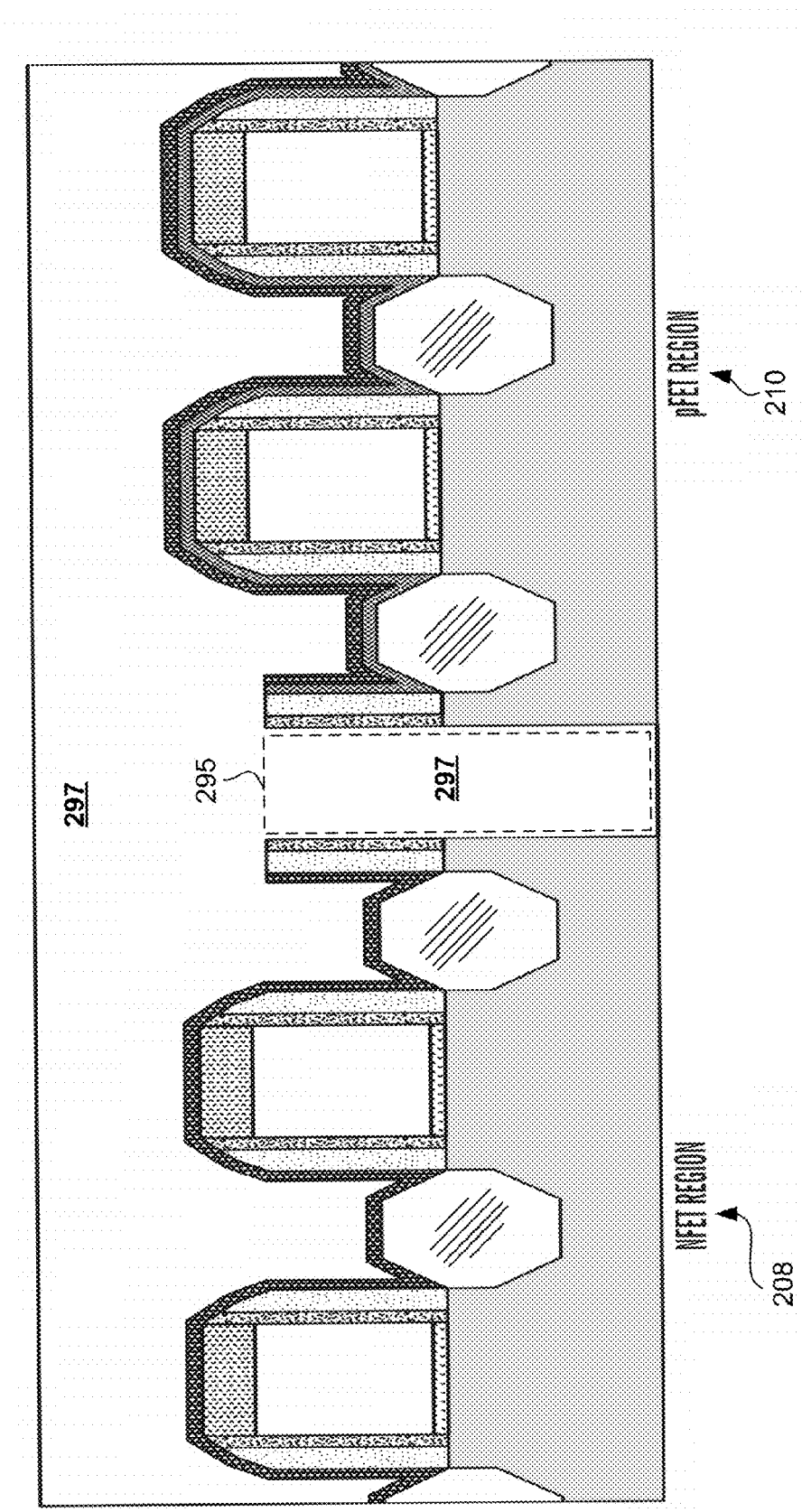
Figure 2N:
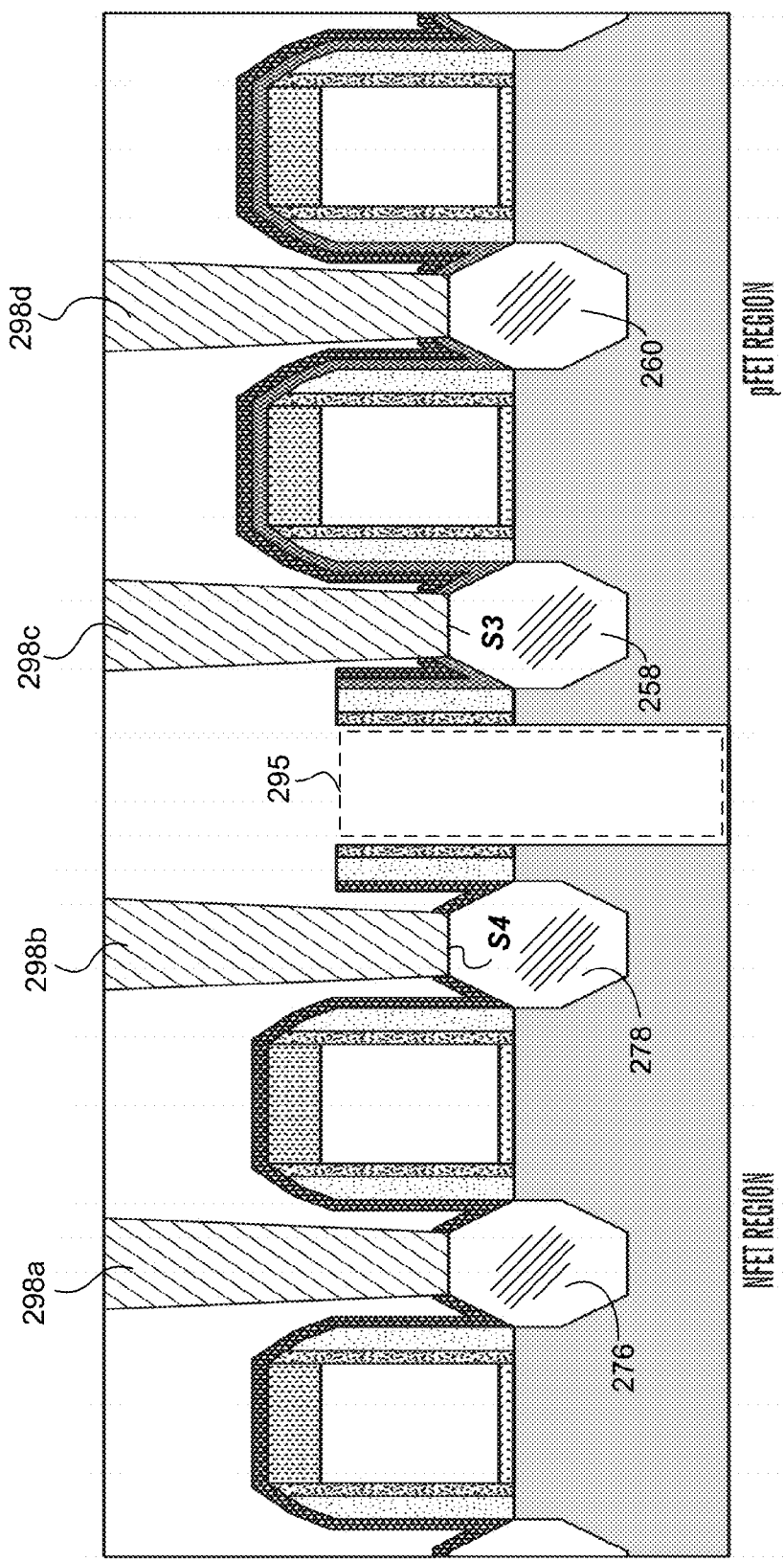

FIGS. 2A-2N illustrate exemplary semiconductor structures and processes associated with forming facet-less epitaxial regions according to at least one embodiments. In particular, the exemplary embodiments of FIGS. 2A-2N illustrate the formation of facet-less epitaxial source/drain regions for adjacently located nFET and pFET devices on a semiconductor substrate.

Referring to FIG. 2A, structure 200 may include a substrate 216, a gate dielectric layer 214 formed on top of the substrate 216, and a gate conductor layer 212 formed on the gate dielectric layer 214. In order to form a gate structure, a hardmask nitride layer and a photoresist layer are formed. The hardmask nitride layer is formed over the gate conductor layer 212 and the photoresist layer is formed over the hardmask nitride layer for creating hardmask patterning.

Accordingly, a gate hardmask stack 202 is produced using photo lithography and reactive ion etching (RIE) processes. At this process stage, the gate hardmask stack 202 is formed of photo resist sections 204a-204e located on top of cap nitride layers 206a-206e, respectively. According to one embodiment, the material forming the cap nitride layers 206a-206e may be a combination of oxide and nitride. As illustrated, nFET region 208 and pFET region 210 may be formed on a continuous portion 220 of the substrate 216, which may define the active region of both the subsequently produced nFET and pFET devices (e.g., see FIG. 2L). The active region of each nFET or pFET device may include the area in which the gate and the source/drain (S/D) regions are formed. Generally, the active region may be defined as regions of the semiconductor substrate that may be utilized for the fabrication of active devices (e.g., nFET, pFET, etc.).

Figure 1:
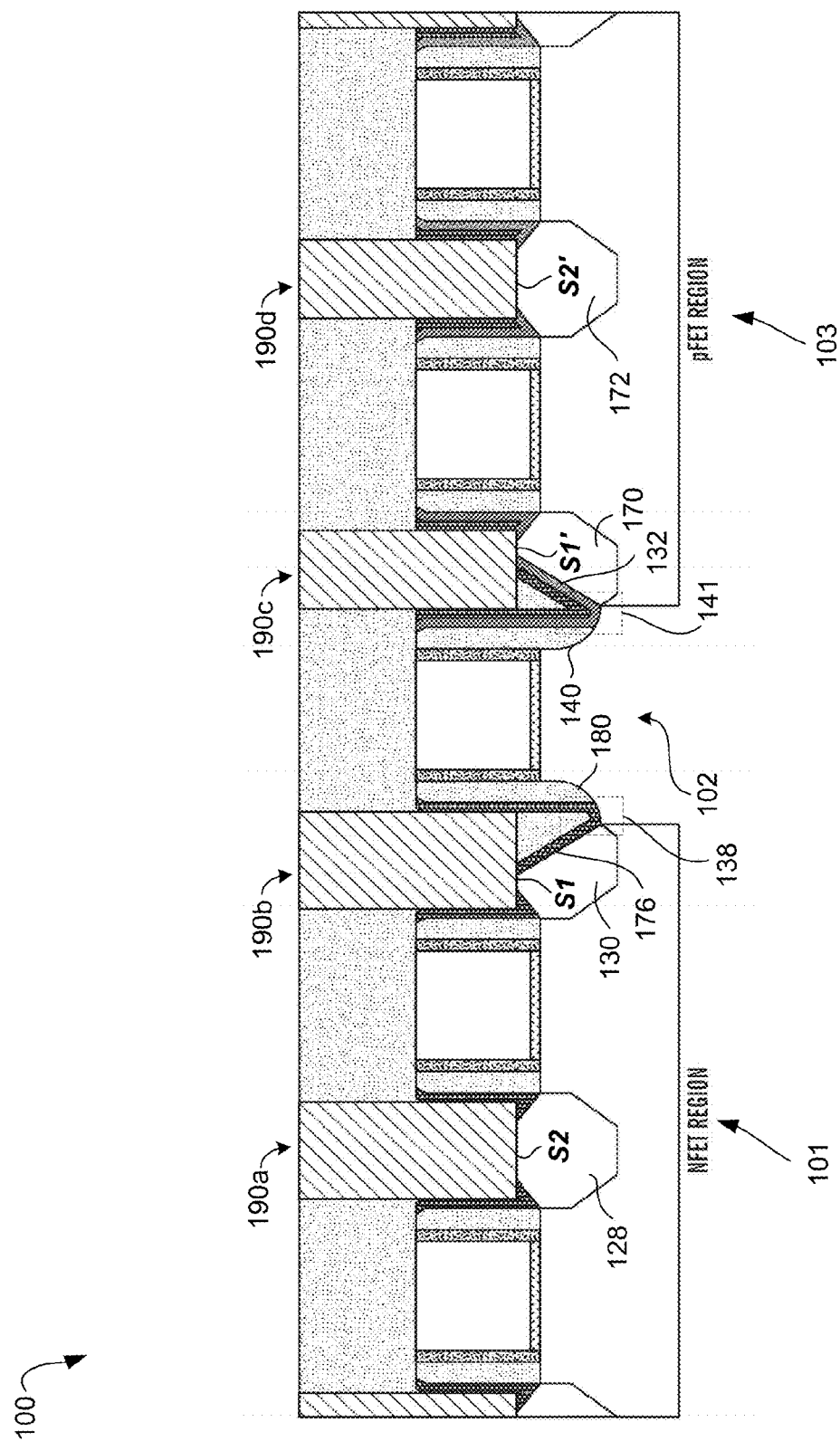
FIG. 1 is a vertical cross-sectional view of a semiconductor structure that illustrates the formation of facetted epitaxial regions located at the edges of an STI region, as is known in the art.

FIG. 2B illustrates the resulting structure following the removal of the photo resist sections 204a-204e (FIG. 2A) from the gate hardmask stack 202 (FIG. 2A) and applying a dry etch such as a RIE etch process to regions 226a-226d (FIG. 2A) of gate conductor layer 212 (FIG. 2A) in order to produce gate structure 228. As illustrated, gates 230a-230e of gate structure 228 are formed on substrate 216 and include cap nitride layers 206a-206e, gate electrode layers 232a-232e, and gate dielectric insulator layers 234a-234e, respectively. In one embodiment, gate 230c may be designated as a dummy gate, as described below in more detail. In contrast with the structure described in FIG. 1, the active area of the nFET region 236 and the active area of the pFET region 238 located on the substrate 216 are not separated, at this stage, by any shallow-trench-isolation region such as STI 102 as illustrated in prior art FIG. 1. Rather, as defined by region 220 (FIG. 2A), the active areas of the nFET region 236 and the active areas of the pFET region 238 are continuous and not separated until later process stages.

Referring to FIG. 2C, using conventional processes, a first set of spacers 240a-240e are formed on the sidewalls of gates 230a-230e by depositing a nitride layer (not shown) followed by a RIE process. In some embodiment, a second set of spacers 242d-242f are formed next to the first set of spacers 240c-240e of gates 230c-230e. Although, according to the depicted embodiment, two sets of spacers are formed, a single set of spacers, such as only the second set of spacers, may be contemplated. Alternatively, according to other implementations, more than two sets of spacers may be formed. As depicted, during the RIE process, active region 236, which includes the nFET region and part of dummy gate 230c, is protected by photo resist layer 248. Thus, active region 238, which includes the pFET region and the other unprotected portion of dummy gate 230c, is exposed to create the second set of spacers 242d-242f via the RIE process.

FIG. 2D illustrates the resulting structure following the removal of photo-resist layer 248 (FIG. 2C) after creating source/drain recesses 250 and 252 in the silicon layer 254 of the pFET region 210 of semiconductor layer 216. As previously described, the photo-resist 248 layer (blocking nFET region 208) in FIG. 2C may be stripped by a sulphuric acid/hydrogen peroxide solution and or plasma strip in oxygen or hydrogen plasma. The source/drain recesses 250 and 252 within the silicon layer 254 may be produced by an etch process using HBr containing plasma, which is selective to both the cap nitride layers 206c-206e and the spacer structures 242d-242f. As illustrated, the controlled sloped profile of the produced recesses, as defined by 256a-256d, may be intentionally provided for strain engineering to maximize device performance by increasing strain in the transistor channel for higher carrier or hole mobility.

Referring to FIG. 2E, epitaxial SiGe source/drain regions 258 and 260 may be epitaxially grown in recesses 250 and 252, respectively. The epitaxial SiGe material contains SiGe, where the concentration of Ge may be around 15-35% for optimal performance. Epitaxial growth conditions may include a $GeH_4$ and $SiH_4$ ($SiH_2Cl_2$) mixture in a hydrogen ambient, at a temperature range of about 500-900° C., and under a pressure in the range of approximately 0.1-100 Torr. Pre-cleaning prior to epitaxial growth may be an important factor for quality concerns. For example, a typical process may be an HF containing wet clean to terminate with hydrogen at the Si surface. Also, a hydrogen bake may be a typical process before epitaxial growth. As illustrated, in contrast to the structure of FIG. 1, the resulting epitaxial profile of the grown source/drain region 258 may not provide a relatively large isolation region (i.e., STI region) facet 132 (FIG. 1), as produced in source/drain region 170 (FIG. 1). Accordingly, the surface region S3 of source/drain region 258 may not exhibit a reduced surface region S1' (FIG. 1) such as source/drain region 170 (FIG. 1). The epitaxial SiGe source/drain regions 258, 260 may be doped using, for example, Boron as a pFET Source/Drain dopant.

Referring back to FIG. 1, the STI region 102 and divot 140, coupled with the nature of epitaxial growth, may contribute to creating an undesirable faceting (e.g., facet 132) at the interface 141 between the STI region 102 and the source/drain region 170. In contrast, in FIG. 2E the epitaxial SiGe source/drain regions 258, 260 are formed on a continuous active region that may include nFET active region 236 and pFET active region 238. The continuous active region thus facilitates the epitaxial growth of source/drain regions 258, 260 without an isolation region such as divoted STI region 102 (FIG. 1), which in turn may avoid the faceting (e.g., FIG. 1: facet 132) that is observed in the structure of FIG. 1. In addition, the epitaxial SiGe source/drain regions 258, 260 may be epitaxially grown on active region 238 in a self-aligned manner utilizing gates 230c-230e.

Referring to FIG. 2F, a protective layer 264 may be formed within both nFET region 208 and pFET region 210 in order to prevent any epitaxial growth in subsequent process steps. A typical material for the protective layer may be silicon nitride having a thickness in the range of about 5-30 nm. Silicon nitride may be formed with LPCVD in $NH_3$ and $SiH_2Cl_2$ ambient, and at a temperature range of approximately 300-800° C., or alternatively, using another variation of the LPCVD process (e.g., MLD: Molecular Layer Deposition). Photo-resist layer 266 is then provided for resist patterning in order to block or mask pFET region 210.

Referring to FIG. 2G, spacers 268a, 268b, and 268c are formed via a RIE process in the nFET region 208 only. Spacers 268a, 268b, and 268c may be a combination of spacer material 247 (FIG. 2D) and protective layer 264 (FIG. 2F). As illustrated, the pFET region 210 is protected by photo-resist layer 266. Source/drain recesses 270 and 272 are formed within silicon layer 254 of the nFET region 208 of semiconductor layer 216. The photo-resist layer 266 (blocking pFET region 210) may be stripped by a sulphuric acid/hydrogen peroxide solution and or plasma strip in oxygen or hydrogen plasma. The source/drain recesses 270 and 272 within the silicon layer 254 may be produced by an etch process using HBr containing plasma, which is selective to both the cap nitride layers 206a-206c in FIG. 2B and the spacer structures 268a-268c. As illustrated, the controlled sloped profile of the produced recesses, as defined by 274a-274d, may be intentionally provided for strain engineering to maximize device performance by increasing strain in the nFET transistor channel for higher electron mobility.

Referring to FIG. 2H, within nFET region 208, carbon doped source/drain regions 276 and 278 may be epitaxially grown in recesses 270 and 272, respectively. The carbon concentration for the epitaxial source/drain regions 270, 272 may be in the range of about 0.1-10% (atomic percentage) depending on the required strain in the channel region. Carbon concentration may, therefore, be adjusted to maximize strain in the channel in order to enhance electron mobility. Excessive carbon concentration may, on the other hand, relax strain in the channel due to defect formation. Adequate carbon concentration may depend on all process steps, including thermal budget considerations and defects formed typically due to ion implantation.

As described in relation to FIG. 1, the STI region 102 and divot 180, coupled with the nature of epitaxial growth, contribute to creating the undesirable faceting (e.g., facet 176) at the interface 138 between the STI region 102 and the source/drain region 130. In FIG. 2H the epitaxial Carbon doped source/drain regions 276, 278 are instead formed on the continuous active region including nFET active region 236 and pFET active region 238. As illustrated, in contrast to the structure of FIG. 1, the resulting epitaxial profile of grown source/drain region 278 does not create the relatively large isolation region (i.e., STI region) facet 176 (FIG. 1), as defined by source/drain region 130 (FIG. 1). As shown in FIG. 2H, the surface region S4 of source/drain region 278 does not cause a reduced surface region S1 (FIG. 1) such as source/drain region 130 (FIG. 1). The epitaxial Carbon doped source/drain regions 276, 278 may be doped using, for example, Arsenic or phosphorus.

As previously described, the continuous active region, defined by 236 and 238, facilitates the epitaxial growth of source/drain regions 270, 272 prior to the formation of an isolation region in between. This in turn avoids the faceting (e.g., FIG. 1: facet 176) that is observed in the structure of FIG. 1. Thus, both the nFET and pFET epitaxial source/drain regions 278, 258 are grown prior to providing any isolation between the nFET region 208 and the pFET region 210. In accordance with the depicted embodiments, dummy gate 230c may facilitate the creation of an isolation region between nFET region 208 and the pFET region 210.

Referring to FIG. 2I, a MOL (Middle Of Line) nitride liner 282 is deposited over the structure of FIG. 2H in order to protect the surfaces of epitaxially grown source/drain regions 258, 260, 276, and 278 during subsequent device fabrication steps.

Referring to FIG. 2J, a MOL (Middle Of Line) inter layer dielectric (ILD) layer 283 may be formed over the structure of FIG. 2I using, for example, a low temperature CVD oxide such as plasma oxide. As depicted, the ILD layer 283 may be planarized (e.g., using CMP) down to the top-surface T of the MOL liner 282. A cut mast (not shown) may then be used to pattern a photo resist layer in a manner whereby photo resist section 285a covers portion 286 of nFET region 208 and photo resist section 285b covers portion 288 of pFET region 210. Since the open center region (i.e., cut) of the cut mask leaves region 290 of the photo resist layer exposed, RIE etching processes may be utilized to etch into dummy gate 230c. As described in the following paragraphs, the dummy gate 230c facilitates a self-aligned etching process (see FIG. 2L) based on the differences in etch selectivity between, for example, gate electrode 232c and cap nitride layer 206c, spacers 240c, 242d, 268c, liner 282, and protective layer 264. Based on this self-aligned etch process, the dummy gate 230c can then be used to form an isolation region between the nFET region 208 and pFET region 210. Particularly, the above approach accordingly avoids the undesirable faceting that may be produced at, for example, the interfaces between the epitaxially grown regions (e.g., source/drain regions) and the STI regions (e.g., see FIG. 1).

Referring to FIG. 2K, based on the cut mask, oxide and nitride etching processes may be used to etch away cap nitride layer 206c (FIG. 2J); a top portion of spacers 240c, 242d, and 268c (FIG. 2J); a portion of liner 282 (FIG. 2J); a portion of protective layer 264 (FIG. 2J), as well the exposed areas E of the ILD layer 283 defined by the width W of the cut mask. This first etching process may be performed by CF containing plasma such as, for example, a combination of $CHF_3$, $CF_4$, and Oxygen as a RIE etching gas. The etching may be stopped at the top surface 281 (FIG. 2J) of the gate electrode 232c (FIG. 2J).

Referring to FIG. 2L, during a second etch process, region 287a, which corresponds to the polysilicon material of the gate electrode 232c (FIG. 2K), is removed using, for example, HBr containing chemistry. The gate electrode 232c (FIG. 2K) removal is self-aligned based on the etch resistance of spacer regions 289a-289b; nitride regions 291a-291b, 293; and ILD regions 290a-290b to the HBr etch process. This self-aligned etch selectivity may occur as a result of the nitride and oxide based materials that are used to form the spacers 289a-289b; nitride regions 291a-291b, 293; and ILD regions 290a-290b. Thus, during the HBr etch process, while the polysilicon material of the gate electrode 232c (FIG. 2K) is removed, the spacers 289a-289b; nitride regions 291a-291b, 293; and ILD regions 290a-290b may substantially remain intact as a result of their resistance to the HBr etch. The gate dielectric 234c (FIG. 2K) may act as a natural etch stop during this second etch process.

During a third etch process, region 287b, which corresponds to gate dielectric 234c (FIG. 2K), is removed using, for example, CF containing plasma such as a combination of $CHF_3$, $CF_4$, and Oxygen as a RIE etching gas. Since the thickness of the gate dielectric 234c (FIG. 2K) is so small (e.g., nanometer range), the third etch process corresponding to removing the gate dielectric 234c (FIG. 2K) occurs over a relatively short period of time. Thus, the spacers 289a-289b; nitride regions 291a-291b, 293; and ILD regions 290a-290b remain substantially unaffected by this third etch process. Although the etch chemistry may be compatible with removing oxide and nitride material, the short time period required for etching away the gate dielectric 234c (FIG. 2K) during the third etch leaves the spacers 289a-289b; nitride regions 291a-291b, 293; and ILD regions 290a-290b substantially in tact.

During a fourth etch process; region 287c of the silicon substrate 216 is removed using, for example, HBr containing chemistry. As with the gate electrode 232c (FIG. 2K), the removal of silicon region 287c is self-aligned based on the etch resistance of spacers 289a-289b; nitride regions 291a-291b, 293; and ILD regions 290a-290b to the HBr etch process. This self-aligned etch selectivity may occur as a result of the nitride and oxide based materials that are used to form the spacers 289a-289b; nitride regions 291a-291b, 293; and ILD regions 290a-290b. Thus, during the HBr etch process, while the silicon region 287c is removed, spacers 289a-289b; nitride regions 291a-291b, 293; and ILD regions 290a-290b may substantially remain intact as a result of their resistance to the HBr etch. The silicon region 287c may be etched down to, for example, a dept (D) of about 200 nm from the surface of the silicon substrate 216.

As depicted and described, the self alignment of the second, third, and fourth etching processes allows the width of the cut mask, as defined by W (FIG. 2K), to be relaxed to a dimension greater than the width $W_g$ (FIG. 2K) of the dummy gate structure (e.g., ~20 nm). As shown in FIG. 2K, the maximum width $W_{max}$ (FIG. 2K) of the cut mask may be extended up to each gate 230b, 230d adjacent to dummy gate 230c. Thus, the ability to utilize a wider cut mask may provide the advantage of lower cost and less complex lithographic tools for the cut mask processes. For example, as gate sizes decrease, a corresponding decrease in the dimensions of the required cut masks, without the self-alignment benefit, may give rise to limitations in the lithographic process. This in turn may require enhancements to the lithographic process such as optical proximity correction (OPC) techniques and/or precision optics (i.e., optical sources, lenses, etc.).

Referring to FIG. 2M, by etching the dummy gate 230c (FIG. 2L) structure, an isolation region 295 may be formed by filing trench or opening 296 (FIG. 2L) with a MOL inter layer dielectric (ILD) layer 297 using, for example, a low temperature CVD oxide such as plasma oxide. As depicted, the planarized MOL inter layer dielectric (ILD) layer 297 also covers the nFET and pFET region 208, 210 structures.

As illustrated in FIG. 3N, subsequent contact formation processes may establish electrical connectivity between contacts 298a-298d and epitaxially grown source/drain regions 276, 278, 258, and 260, respectively. According to the described embodiments, epitaxial source/drain regions 276, 278, 258, and 260 are formed without any undesirable faceting that may occur when epitaxially growing source/drain regions adjacent isolation regions such as STI regions. For example, as shown in FIG. 1, based on the created facets 176, 132 that result from the formed divots 180, 140 associated with STI region 102, source/drain regions 130 and 170 include reduced contact surfaces S1 and S1' for connecting to contacts 190b and 190c, respectively. Thus, the reduced surfaces may establish a poor electrical connection with the contacts 190b, 190c. By contrast, in FIG. 2N, epitaxial source/drain region 278, which is adjacent isolation or trench region 295, exhibits no faceting as a result of the isolation region 295. Rather, the source/drain region 278 is grown with controlled facets directly on the active region prior to formation of the isolation region 295. Similarly, epitaxial source/drain region 258, which is also adjacent isolation or trench region 295, exhibits no faceting as a result of the isolation region 295. Rather, as with source/drain region 278, source/drain region 258 is also grown with controlled facets directly on the active region prior to formation of isolation region 295. Thus, there is no surface area reduction associated with source/drain regions 278 and 258 based on their proximity to the isolation region 295. Accordingly, contact surfaces S4 and S3 do not exhibit the same reduced contact areas as contact surface S1 (FIG. 1) and S1' (FIG. 1), respectively.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiments, the practical application or technical improvement over technologies found in the marketplace, or to enable others of ordinary skill in the art to understand the embodiments disclosed herein.

What is claimed is:

1. A method of forming a semiconductor structure on a substrate, the method comprising:
   preparing a continuous active layer in a region of the substrate;
   forming a plurality of gates on top of the continuous active layer of the substrate;
   depositing a first raised epitaxial layer on a first recessed region of the continuous active layer, the first recessed region located between a first and a second one of the plurality of gates, wherein the first and the second one of the plurality of gates are adjacent;
   depositing a second raised epitaxial layer on a second recessed region of the continuous active layer, the second recessed region located between the second and a third one of the plurality of gates, wherein the second and the third one of the plurality of gates are adjacent;
   etching, using a cut mask, a trench structure into the second one of the plurality of gate structures and a region underneath the second one of the plurality of gates in the continuous active layer, the etching including a first etch for removing a cap nitride layer of the second one of the plurality of gates, and the etching including a second etch aligned with multilayered sidewalls of the second one of the plurality of gates, the multilayered sidewalls including a first spacer pair, a second spacer pair formed over the first spacer pair, a protective nitride layer formed over one of the second spacer pair, and a nitride liner formed only over another one of the second spacer pair, the first and the second raised epitaxial layer separated from the trench structure by the first and the second spacer pair, the protective nitride layer, and the nitride liner, the protective nitride layer and the nitride liner including two separately formed layers, wherein the protective nitride layer is formed prior to the formation of nitride liner; and
   filling the trench structure with isolation material, the isolation material electrically isolating the first raised epitaxial layer from the second raised epitaxial layer.

2. The method of claim 1, wherein the second one of the plurality of gates comprises a dummy gate including:
   a gate electrode having first side walls;

the cap nitride layer formed on top of the gate electrode, the cap nitride layer having second side walls extending upward from the first sidewalls of the gate electrode; and spacers located on the first and the second side walls, wherein the gate electrode, spacers, and cap nitride layer are covered by an interlayer dielectric (ILD) layer.

3. The method of claim 2, wherein the etching, using a cut mask, the trench structure comprises:

etching the cap nitride layer; and etching an upper portion of the spacers adjacent the cap nitride layer, wherein the etching of the upper portion forms spacer portions.

4. The method of claim 3, further comprising:

etching the gate electrode down to a gate dielectric layer underlying the gate electrode, the gate electrode etching being selective to the spacer portions located on the first sidewalls of the gate electrode, the etching of the gate electrode creating at least a portion of the trench structure, the portion of the trench structure being aligned with the spacer portions.

5. The method of claim 4, wherein the gate electrode comprises a polysilicon material and the spacer portions comprise a nitride material.

6. The method of claim 4, further comprising:

etching the gate dielectric, wherein the etching of the gate dielectric is aligned with the spacer portions as a result of the spacer portions being resistant to the etching of the gate dielectric on the basis of the thickness of the gate dielectric causing the gate dielectric to be etch away prior to the spacer portions.

7. The method of claim 6, wherein the gate dielectric comprises a high-K dielectric material.

8. The method of claim 6, further comprising:

etching into a third region of the continuous active layer, the third region underlying the gate electrode, wherein the etching of the third region is selective to the spacer portions, the etching of the third region aligned with the spacer portions.

9. The method of claim 8, wherein the third region comprises a silicon material and the spacer portions comprise a nitride material.

10. The method of claim 3, wherein etching the cap nitride layer, etching the upper portion of the spacers, and etching the portion of the ILD layer comprises reactive ion etching (RIE) using a gas mixture including CF containing plasma.

11. The method of claim 4, wherein etching the gate electrode comprises a reactive ion etching (RIE) using a gas mixture including HBr.

12. The method of claim 6, wherein etching the gate dielectric comprises reactive ion etching (RIE) using a gas mixture including CF containing plasma.

13. The method of claim 8, wherein etching into the third region comprises reactive ion etching (RIE) using a gas mixture including HBr.

14. The method of claim 1, wherein:

depositing the first raised epitaxial layer comprises depositing a first raised source/drain layer of a first transistor; and depositing the second raised epitaxial layer comprises depositing a second raised source/drain layer of a second transistor.

15. The method of claim 1, wherein filling the trench structure with isolation material comprises filling the trench structure with high density plasma (HDP) oxide.

16. The method of claim 1, wherein the etching, using a cut mask, comprises:

providing a cut mask including a first width, the first width being greater than a second width corresponding to the second one of the plurality of gates, and the first width being less than a distance separating the first and the third one of the plurality of gates.

17. A method of forming a semiconductor structure on a substrate, the method comprising:

preparing a continuous active layer in a region of the substrate;

forming a first gate, a dummy gate, and a second gate and on top of the continuous active layer of the substrate, the dummy gate including at least one pair of spacers;

depositing a first raised epitaxial layer on a first recessed region of the continuous active layer, the first recessed region located between the first gate and the dummy gate, wherein the first gate and the dummy gate are adjacent;

depositing a second raised epitaxial layer on a second recessed region of the continuous active layer, the second recessed region located between the dummy gate and the second gate, wherein the dummy gate and the second gate are adjacent;

etching a trench structure into the dummy gate and a region underneath the dummy gate in the continuous active layer, wherein the etching of the trench structure into the dummy gate is selective to the at least one pair of spacers, the etching including a first etch for removing a cap nitride layer of the dummy gate, and the etching including a second etch aligned with multilayered sidewalls of the dummy gate, the multilayered sidewalls including the at least one pair of spacers, a protective nitride layer formed over one of the at least one pair of spacers, and a nitride liner and the protective nitride layer formed over another one of the at least one pair of spacers, wherein the protective nitride layer is formed over a portion of the dummy gate and the nitride liner is formed over the entire dummy gate and directly on the protective nitride layer, the first and the second raised epitaxial layer separated from the trench structure by the at least one pair of spacers, the protective nitride layer, and the nitride liner; and filling the trench structure with isolation material, the isolation material electrically isolating the first raised epitaxial layer from the second raised epitaxial layer.

18. The method of claim 17, wherein the etching of the trench structure into the dummy gate comprises:

etching the dummy gate using a cut mask, the cut mask including a first width being greater than a second width corresponding to the dummy gate, and the first width being less than a distance separating the first and the second gate.

* * * * *